United States Patent [19]
Sato

[11] Patent Number: 5,378,970
[45] Date of Patent: Jan. 3, 1995

[54] IC CARRIER CAPABLE OF LOADING ICS OF DIFFERENT SIZES THEREON

[75] Inventor: Hiroshi Sato, Gyoda, Japan

[73] Assignee: Advantest Corporation, Tokyo, Japan

[21] Appl. No.: 939,722

[22] Filed: Sep. 2, 1992

[30] Foreign Application Priority Data

Sep. 9, 1991 [JP] Japan ................... 3-229093

[51] Int. Cl.$^6$ .............................................. G01R 1/04
[52] U.S. Cl. .................. 324/158.1; 269/233; 439/331; 439/71
[58] Field of Search ............... 269/903, 233; 279/114; 439/507, 331, 71

[56] References Cited

U.S. PATENT DOCUMENTS 4,222,577  9/1980  Giffin ................... 279/114

*Primary Examiner*—Kenneth A. Wieder
*Assistant Examiner*—Barry C. Bowser
*Attorney, Agent, or Firm*—Staas & Halsey

[57] ABSTRACT

An IC carrier for loading ICs of different sizes thereon includes a spiral disk provided in a box-shaped frame member and a plurality of IC support members engaged with a spiral grove of the disk. Rotation of the spiral disc causes the IC support members to shift in position to accommodate ICs of different sizes.

12 Claims, 6 Drawing Sheets

IC CARRIER CAPABLE OF LOADING ICS OF DIFFERENT SIZES THEREON

BACKGROUND OF THE INVENTION

The present invention relates to IC carriers which are used with an IC tester for carrying a number of ICs one by one to test them in a sequential order, and particularly, to IC carriers which can be adjusted to load ICs of different sizes to be tested thereon when ICs to be tested are changed from one size to another.

To test a large number of ICs one after another, there has already been employed an automatic IC tester of the type wherein the ICs are loaded on IC carriers one by one at a loading section, carried to the neighborhood of a test section; unloaded from the IC carriers thereat at a carrying apparatus for removing an IC or ICs by suction and carrying them to the test section, and mounted on IC sockets of the test section for testing. In such an IC tester it is necessary that the IC unloaded from the IC carrier by suction be mounted on the test socket at an accurate position. Accordingly, heretofore special IC carriers are fabricated in accordance with the types and sizes of the ICs to be tested. With an increase in the integration density (level of integration) of ICs, however, the number of terminal leads that are led out of their packages has increased and the terminal lead-out structures or arrangements have also been diversified, ranging from a DIP (dual in-line package) type to QFP (quad flat package), SOP (small out-line package), SOJ (small out-line J-lead package), PLCC (plastic leaded chip carrier) and similar types. Thus, there are various types of ICs and sometimes they are fabricated in different sizes although they are of the same type. Therefore, in the case where the type or size of IC to be tested is changed to another type or size all IC carriers currently disposed in the IC tester must be exchanged manually for IC carriers of the required structure corresponding to the ICs to be tested next. This is very inconvenient this is very troublesome. In addition, since it is necessary to prepare IC carriers corresponding to ICs of all different types and different sizes, the efficiency of use of each IC carrier is low and a large space is needed to store such a large number of IC carriers.

SUMMARY OF THE INVENTION

It is therefore an object of the present invention to provide an IC to be tested to a desired position and can load an IC to be tested thereon by adjustment of positioning members thereof even though the size thereof be changed to another one.

With the structure according to the present invention, the two movable IC support members are moved in opposite directions by rotating the spiral disk, by which the spacing of the positioning plates planted on the IC support members is changed, permitting the positioning for an IC of a different size. Hence, ICs of different sizes can be carried by the same IC carrier. Moreover, it is possible to construct an IC tester wherein ICs of various shapes are carried, by preparing a plurality of types of IC carriers which have movable IC support members of different shapes.

DESCRIPTION OF THE PREFERRED EMBODIMENTS

Figure 1:
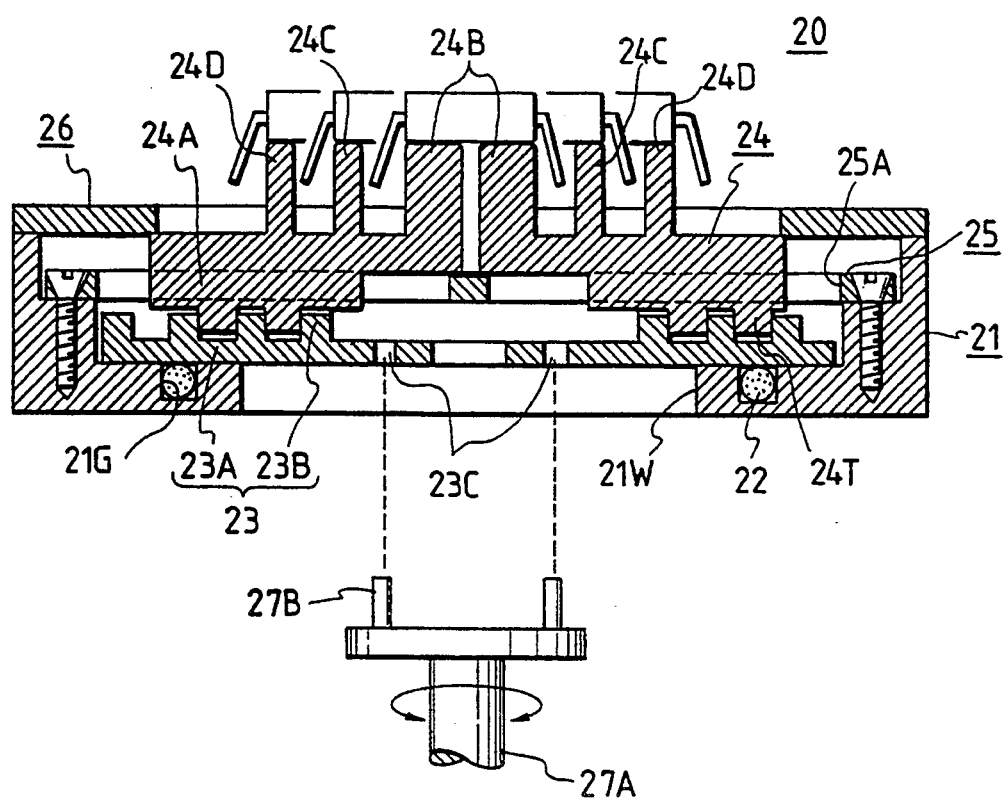
FIG. 1 is a sectional view illustrating an embodiment of an IC carrier according to the present invention.
Figure 2:
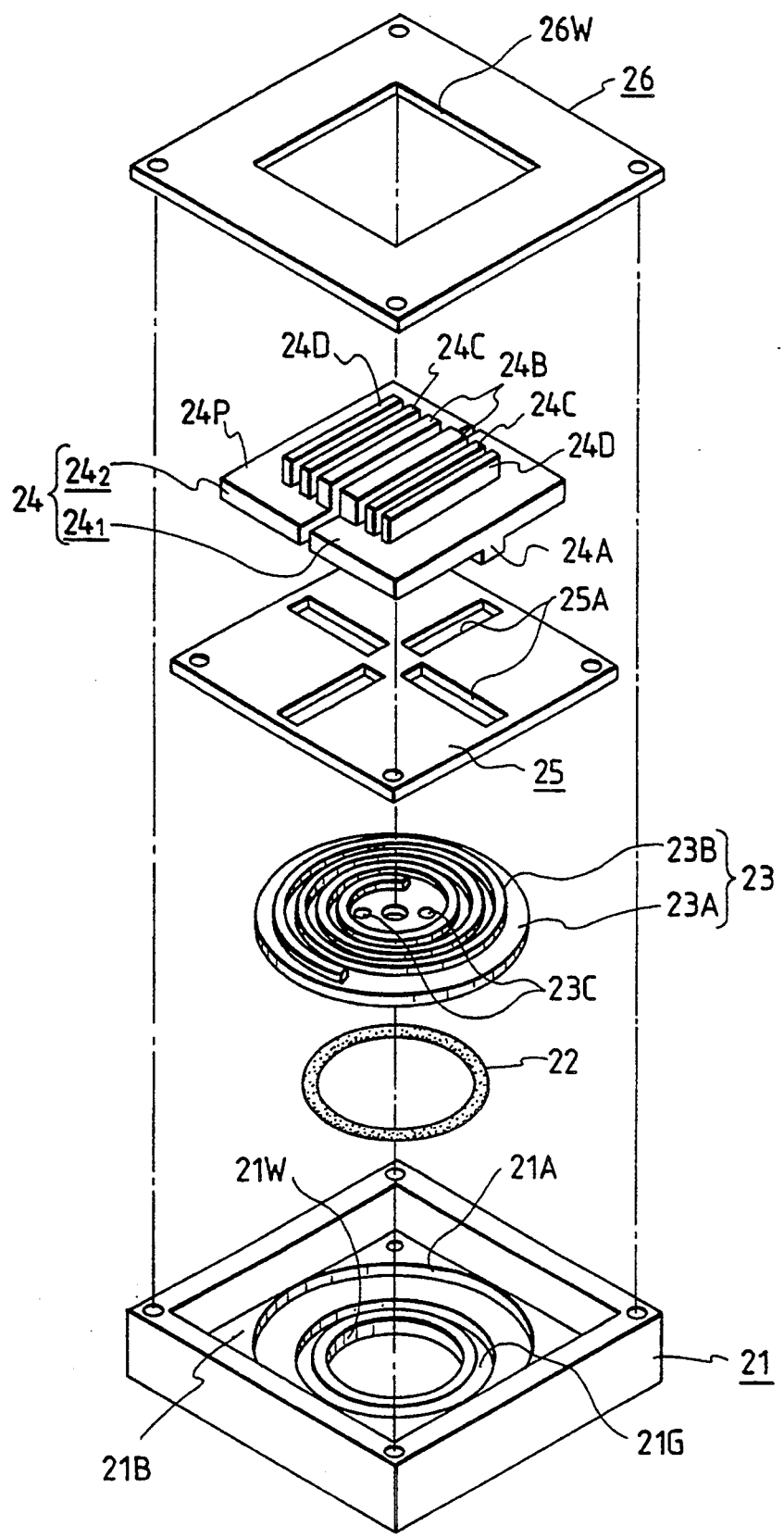
FIG. 2 is an exploded perspective view of the IC carrier depicted in FIG. 1.

FIGS. 1 and 2 are a sectional view and an exploded perspective view of a first embodiment of the IC carrier according to the present invention, showing the construction of an IC carrier for carrying a DIP type IC. Reference numeral 21 indicates a rectangular box-like frame member. Inside the box-like frame member 21 is formed a circular concavity or recess 21A in the inner surface of the bottom 21B thereof and O-ring 22 is received in an annular groove 21G formed in the concavity 21A and concentrically therewith. A disk 23 having a spiral protrusion or groove formed on one surface (upper surface in this example) thereof is mounted within the circular concavity 21A with the other surface of the disk 23 abutting against the O-ring 22 and the surface of the concavity 21A in such a manner that the disk 23 is rotatable within the circular concavity 21A. As shown in FIG. 2, in this example, the disk 23 comprises a disk member 23A and a spiral protrusion 23B formed on the upper surface of the disk member 23A (hereinafter referred to as "spiral disk"). This spiral protrusion 23B also provides a spiral groove on the disk member 23A. Of course, a spiral groove may be formed in the upper surface of the disk member 23A instead of the annular protrusion 23B. A window or opening 21W through which a drive means for rotating the spiral disk 23 can be inserted from the outside is made in the bottom 21B of the box-like frame member 21 at the inside of and concentrically with the annular groove 21G. In the central region of the disk member 23A of the spiral disk 23 in which the spiral protrusion 23B is not formed, there are two small through holes 23C at diametrical positions symmetrical with respect to the center of the disk 23, with which the drive means can be engaged to rotate it as described later.

In the box-shaped frame member 21 an IC support 24 is disposed on the upper surface of a rectangular guide plate 25 fixed to the frame member 21 at the inside thereof over the spiral disk 23, and the IC support 24 is slidably held in the frame member 21 by a rectangular frame-like cover plate 26 having a rectangular window 26W which abuts against the marginal portions of the top of the IC support 24. The IC support 24 is composed of a pair of rectangular movable support members $24_1$ and $24_2$ disposed diametrically and symmetrically with respect to the center of the spiral disk 23. The movable support members $24_1$ and $24_2$ each have a rectangular sliding plate 24P; a plurality (three in this example) of positioning plates 24B, 24C and 24D spaced apart from one another and protrusively formed on the top of the sliding plate 24P in parallel to its longer side; a guide ridge 24A formed on the underside of the sliding plate 24P and extending at right angles to the longer side thereof; and a plurality of projections 24T protrusively provided on the underside of the ridge 24A and engaged with the spiral groove on the spiral disk 23. Only one projection may also be provided on each support member. The rectangular guide plate 25P has, in this example, four elongated guide slots 25A extending toward the center of the plate 25 from the central of each side thereof and at right angles thereto to make across. In this embodiment two of the four elongated guide slots 25A which extend in the same direction are selectively used.

The two movable support members $24_1$ and $24_2$ are mounted on the guide plate 25 with their longer sides held in parallel with each other and are allowed to move only in a straight-line direction in which the guide ridges 24A received in the respective elongated guide slots 25A can slidably move therein. The projections 24T provided on the guide ridges 24A are in engagement with the spiral groove provided by the spiral protrusion 23B of the spiral disk 23 by inserting driving pins 27B mounted to a drive shaft 27A into the two small through holes 23C of the spiral disk 23 through the window 21W and then rotating the drive shaft 27A by a proper drive means such as a stepping motor. Hence, by turning the spiral disk 23, the two support members $24_1$ and $24_2$, which constitute the support 24, come close to or away from each other, and consequently, the intervals between the positioning plates 24B, between the positioning plates 24C and between the positioning plates 24D change respectively, thereby making it possible to support DIP type ICs of different sizes or mils such as 300 mils, 400 mils, 600 mils and the like. In other words, the IC positioning size is changed.

In FIG. 1, when the spacing or distance between the pair of positioning plates 24B is set so that an IC of a standard of 300 mils is loaded thereon, an IC of a standard of 600 mils can be supported between the pair of positioning plates 24C. In this instance, an IC of a standard of 900 mil can be supported between the pair of positioning plates 24D. Regarding the size of the DIP type ICs there are 400-mil and 740-mil specifications, in addition to the 300-mil, 600-mil and 900-mil standard. Accordingly, when it is desired to support 400-mil and 750-mil ICs, the spacing between the support members $24_1$ and $24_2$ needs only to be increased in the state shown in FIG. 1. That is, by moving the support members $24_1$ and $24_2$ outwardly by 50 mils, respectively, the pair of positioning plates 24B can hold therebetween the IC of the 400-mil standard, and by moving the support members outwardly by 75 mils, respectively, the pair of positioning plates 24C can hold therebetween the IC of the 750-mil standard. The support members $24_1$ and $24_2$ can be moved by turning the spiral disk 23 as mentioned above.

The O-ring 22 is provided to prevent the spiral disk 23 from rotation by a shock or like external force. If the support members $24_1$ and $24_2$ and the box-shaped frame member 21 are so constructed that the shorter sides of the support members $24_1$ and $24_2$ are in contact with the inner wall surfaces of the frame member 21 and can slidably move toward and away from each other along the inner wall surfaces of the frame member 21, the guide plate 25 may be removed. By engaging the driving pins 27B, attached to the drive shaft 27A as shown in FIG. 1, with the two small holes 23C of the spiral disk 23 and then rotating a drive shaft as by a stepping motor, the support members $24_1$ and $24_2$ can be set at a desired interval.

To automate the operation of changing the mil standard of the IC carrier 20 from one to another, spacing data currently set in each IC carrier 20 is needed. To this end, the rotational angular position of the spiral disk 23, for example, may be indicated by black and white radial stripes or the like provided on the underside of the disk 23, and the stripes may be optically read through a hole made in the bottom panel of the box-like frame member 21 to obtain the spacing data. Another method is to append each IC carrier with an identification number in the form of a bar code, for instance, and store the previously set value for each identification number in a memory to mange it.

Figure 3:
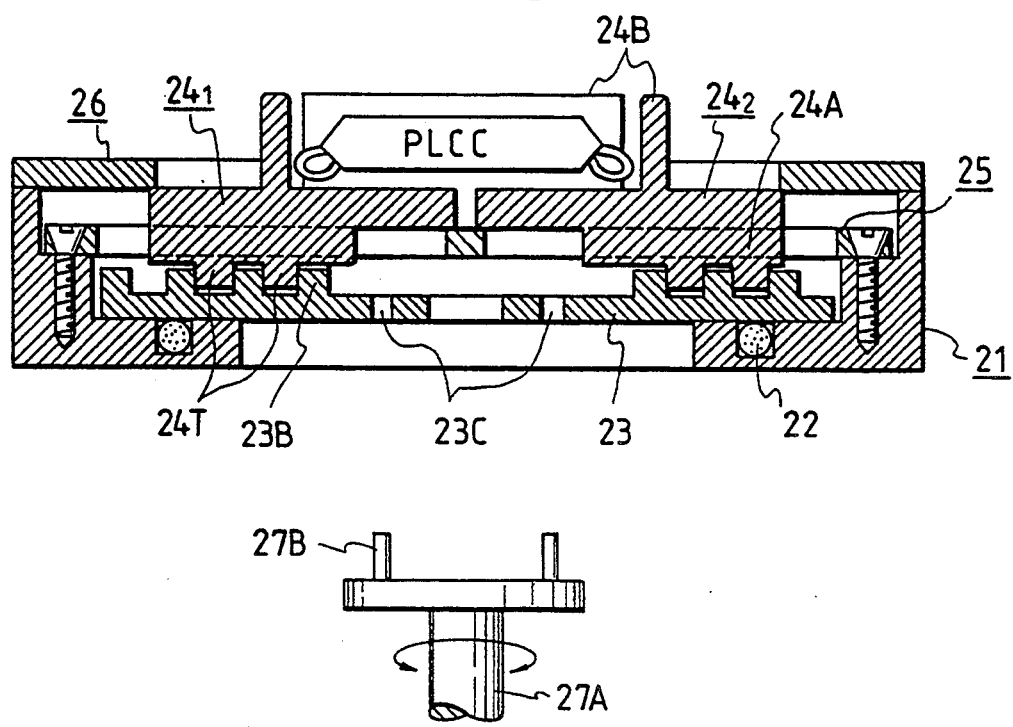
FIG. 3 is a sectional view illustrating another embodiment of an IC carrier according to the present invention.
Figure 4:
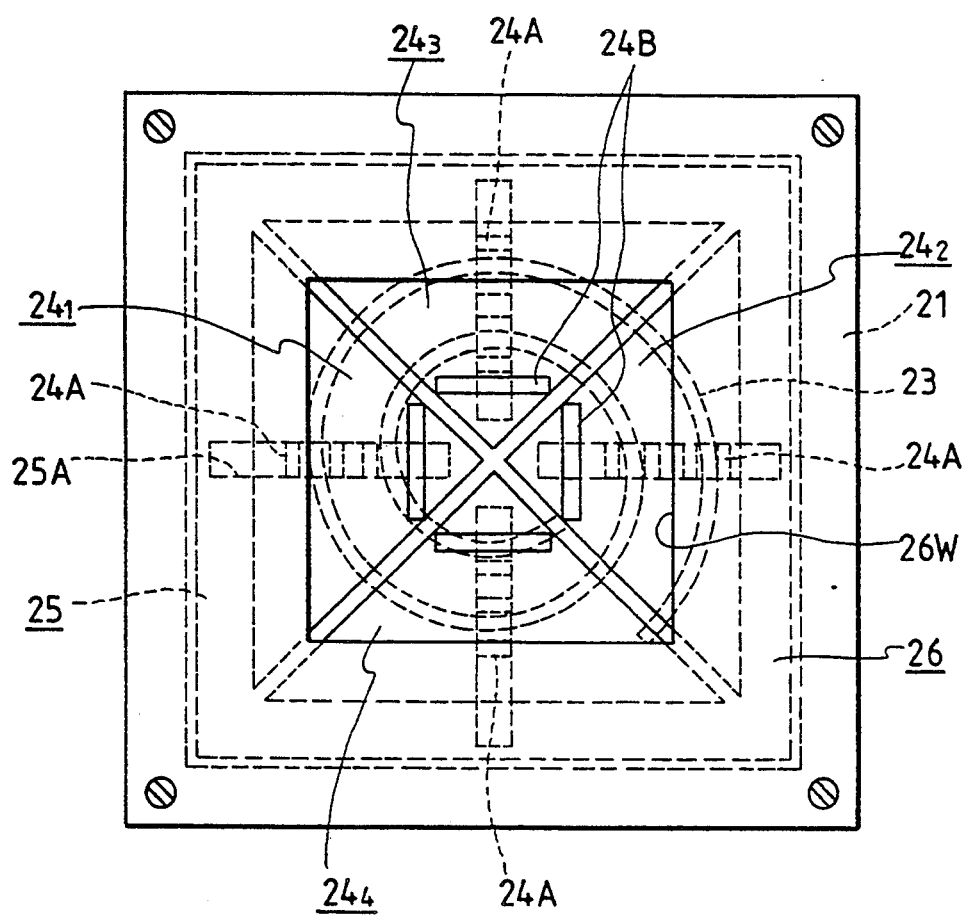
FIG. 4 is a plan view of the IC carrier shown in FIG. 3.

FIG. 3 illustrates an embodiment of an IC carrier which permits positioning of an IC in two perpendicularly intersecting or orthogonal two directions. In this embodiment there is shown the construction of an IC carrier for carrying the PLCC type IC. In the case of the PLCC type IC, its terminal leads are led out from four sides of the package. Accordingly, in this case, four support members $24_1$ through $24_4$ are used which are obtained by dividing the IC support 24 having a parallelogram (rectangle in this example) shaper into four parts along its diagonal lines as depicted in FIG. 4. On each pair of opposed ones of support members $24_1$ to $24_4$ there are provided positioning plates 24B in parallel to each other. The support members $24_1$ to $24_4$ have guide ridges 24A which extend in crosswise, shape as a whole and these four guide ridges 24A are received and guided in elongated guide slots 25A of the guide plate 25 similar to those shown in FIG. 2. Each guide ridge 24A has a plurality of projections 24T projecting downwardly from the underside thereof. The projections 24T are in engagement with the spiral groove provided by the spiral projections 23B of the spiral disk 23 and are slidable in the spiral groove. When the spiral disk 23 is turned, by inserting driving pins 27B mounted to a drive shaft 27A into the two small through holes 23C of the spiral disk 23 through the window 21W and then rotating the drive shaft 27A by a proper drive means such as a stepping motor the four guide ridges 24A are simultaneously guided in the radial direction along the elongated guide slots 25A, and consequently, the size of the rectangular area defined by the positioning plates 24B changes. With this structure, it is possible to construct an IC carrier wherein the PLCC type IC of a different size is loaded and positioned in the rectangular area surrounded by the positioning plates 24B.

Figure 5:
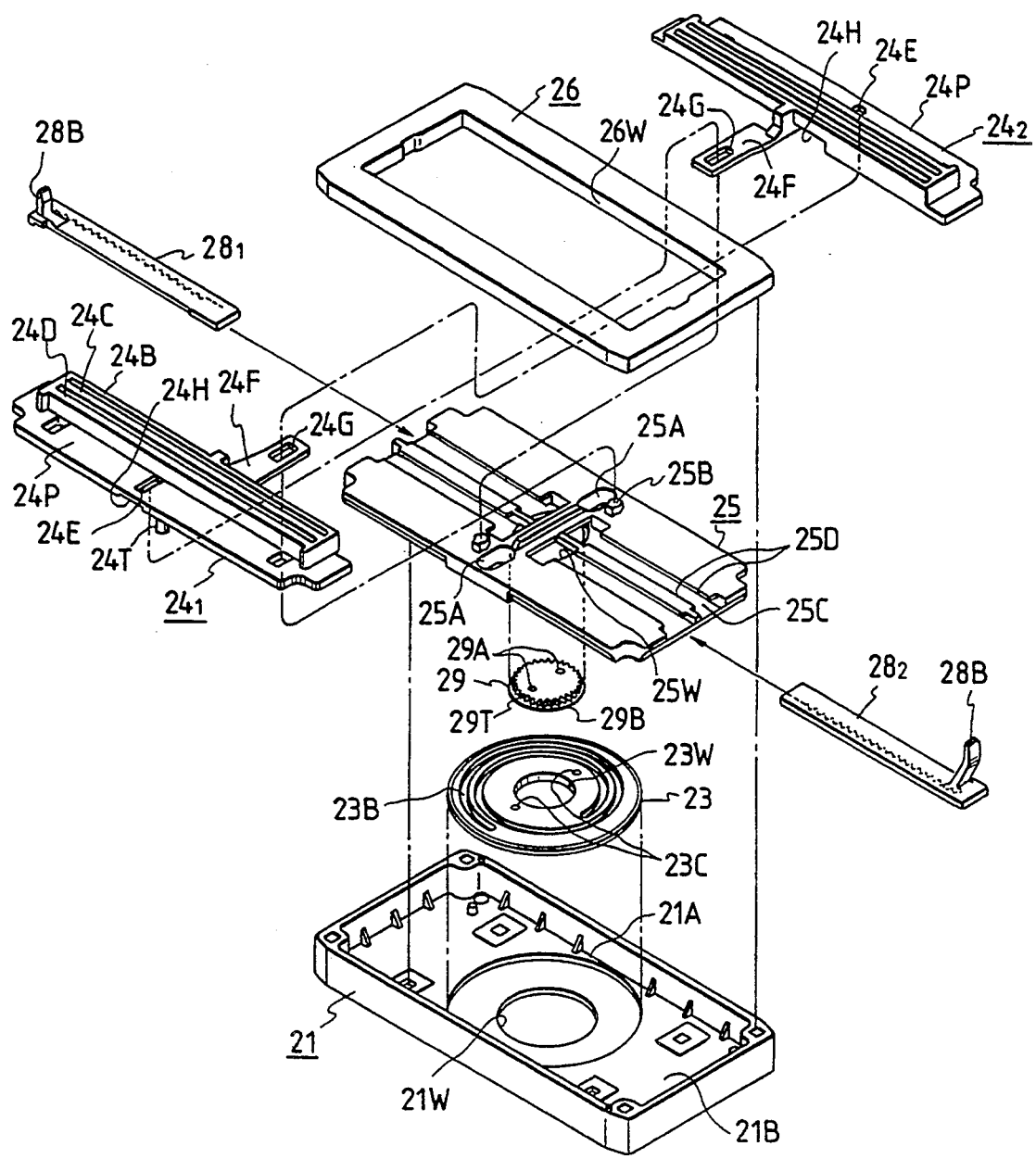
FIG. 5 is an exploded perspective view illustrating still another embodiment of an IC carrier according to the present invention.

FIG. 5 is an exploded perspective view illustrating another embodiment of the IC carrier according to the present invention. In this embodiment, it is possible to move two rectangular support members $24_1$, and $24_2$ in a straight-line direction by rotation of the spiral disk 23 thereby setting the position of the two support members $24_1$, and $24_2$ for an IC to be loaded thereon in the straight-line direction (widthwise of the support members, for example) as in the case of the embodiment of FIG. 1, and further, it is also possible to set the position of the two support members $24_1$, and $24_2$ for an IC to be loaded thereon in a direction perpendicular to the above-mentioned straight-line direction (that is, in the longitudinal direction).

Each part of the FIG. 5 embodiment is formed as a molding of synthetic resin, for instance. As is the case with the FIG. 1 embodiment, the FIG. 5 embodiment is an application of the invention to a carrier for a the DIP type IC. The spiral disk 23 having a spiral groove 23B formed on the supper surface thereof and a central circular window 23W in this example is received in the circular concavity 21A of the box-like frame member 21 and the guide plate 25, into which racks $28_1$ and $28_2$ and a pinion 29, 29 are previously assembled is mounted in the box-shaped frame member 21 above the spiral disk 23A. On the guide plate 25 there are provided two rectangular movable IC support members $24_1$ and $24_2$ each of which has three positioning plates 24B, 24C and 24D spaced apart from one another and protrusively formed thereon and form the IC support 24 as in the embodiment of FIG. 1. A rectangular frame-like cover 26 having a rectangular window 26W is put on the frame member 21 over the support members $24_1$ and $24_2$ to hold them in the frame member 21. The frame-like cover 26 allows the positioning plates 24B, 24C and 24D to project out through its window 26W and, at the same time, abuts against the marginal portions of the movable support members $24_1$ and $24_2$ to keep them slidably in the box-shaped frame member 21.

The movable IC support members $24_1$ and $24_2$ each have a substantially rectangular plate 24P, which has a projection 24T projecting downwardly from its underside at right angles thereto at the center of its longer side, and the projection 24T is received in the spiral groove 23B of the spiral disk 23 through an elongated clearance hole 25A of the guide plate 25. The plate 24P of each of the movable IC support members $24_1$ and $24_2$ has a guide recess 24H formed in the underside of the plate 24P in a direction perpendicular to the longer side thereof (namely, widthwise) adjacent the projection 24T and an elongated guide slot 24E made in the recess 24H. In the same direction as the recess 24H. A platelike arm 24F extends outwardly from the longer side of each plate 24P which is far from the projection 24T at a position thereof opposite to the projection 24T in a direction perpendicular to the longer side of the plate 24P. The flat arm 24F has an elongated guide slot 24G made therein near its free end portion. The elongated guide slots 24E and 24G extend at right angles to the lengthwise direction of the plate 24P. The flat arm 24F of one of the pair of movable IC support members $24_1$ and $24_2$ is slidably received in the guide recess 24H of the other. The elongated guide slot 24G in the flat arm 24F of one of the support members $24_1$ and $24_2$ is equal to the elongated guide slot 24E of the plate 24P of the other in a widthwise direction and they always overlap at least partly in a lengthwise direction. Guide projections 25B protrusively provided on the guide plate 25 are inserted into the overlapping portion of the elongated guide slots 24P and 24G.

When the spiral disk 23 is turned by engaging a drive means with the small through holes 23C of the disk 23 through the window 21W and thereafter rotating the drive means thereby causing the projections 24T of the support members $24_1$ and $24_2$ to slide along the spiral groove 23B the inner wall surfaces of the longer sides of the elongated guide slots 24E and 24G are caused to be guided by the projections 25B only in the longitudinal direction thereof perpendicular to the widthwise direction thereof and the support members $24_1$ and $24_2$ come close to and away from each other with the longer sides thereof held in parallel with each other in a direction perpendicular to their longer sides. Since the elongated guide slots 24E and 24G of each of the support members $24_1$ and $24_2$ are sufficiently spaced apart from each other in a direction perpendicular to the lengthwise direction of the plate 24P, the direction of sliding movement of each of the support members $24_1$ and $24_2$ can be maintained accurately and stably.

In the embodiment shown in FIG. 5, the pinion 29 including a disk 29B and a small-diameter toothed wheel portion 29T formed on the top of the disk 29B concentrically therewith is rotatably received in a circular hole 25W made in the guide plate 25 centrally thereof. In the top of the guide plate 25 there are formed two parallel guide channels 25C which pass over both diametrically opposite portions of the circular hole 25W, respectively, and run through the guide plate 25 in parallel to its longer sides. Each guide channel 25C has inwardly projecting rims 25D along its both upper edges, and the strip-like sliding racks $28_1$ and $28_2$ are received in the guide channels 25C, respectively.

Figure 6:
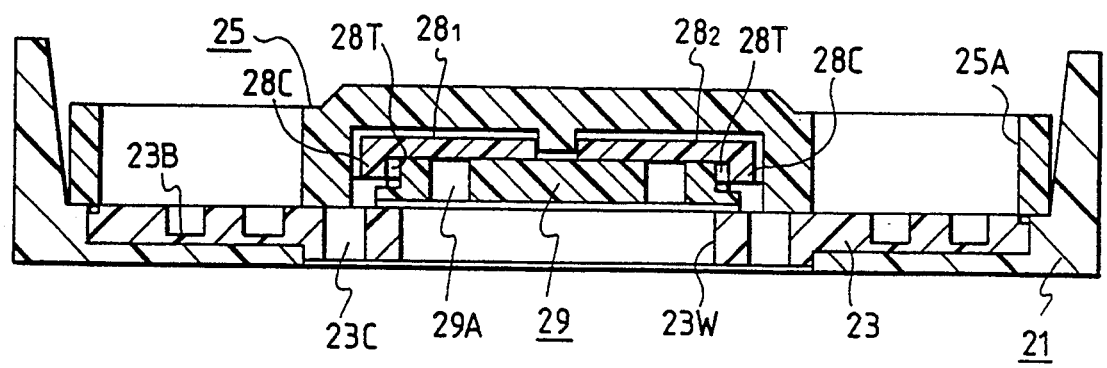
FIG. 6 is a sectional view showing the FIG. 5 embodiment partially assembled.

FIG. 6 shows in section the assembly of the box-like frame member 21, the spiral disk 23, sliding racks $28_1$ and $28_2$ the the guide plate 25 and the pinion 29. Each of the racks $28_1$ and $28_2$ has a ridge 28C extending along the longer side of its underside and each ridge 28 has an engaging tooth 28T formed in the inner side wall thereof which engages with the toothed wheel 29T. When the pinion 29 is turned by engaging driving pins of a drive shaft similar (not shown) to the ones 27B shown in FIG. 1 but having narrower distance therebetween with holes 29A of the pinion 29 through the circular window 23W of the spiral disk 23 and rotating the drive shaft the racks $28_1$ and $28_2$ are caused to slide in parallel to each other and in opposite directions, by which the distance between positioning arms 28B protrusively provided on the racks $28_1$ and $28_2$ can be changed independently of the positioning plates 24B, 24C and 24D.

Figure 7:
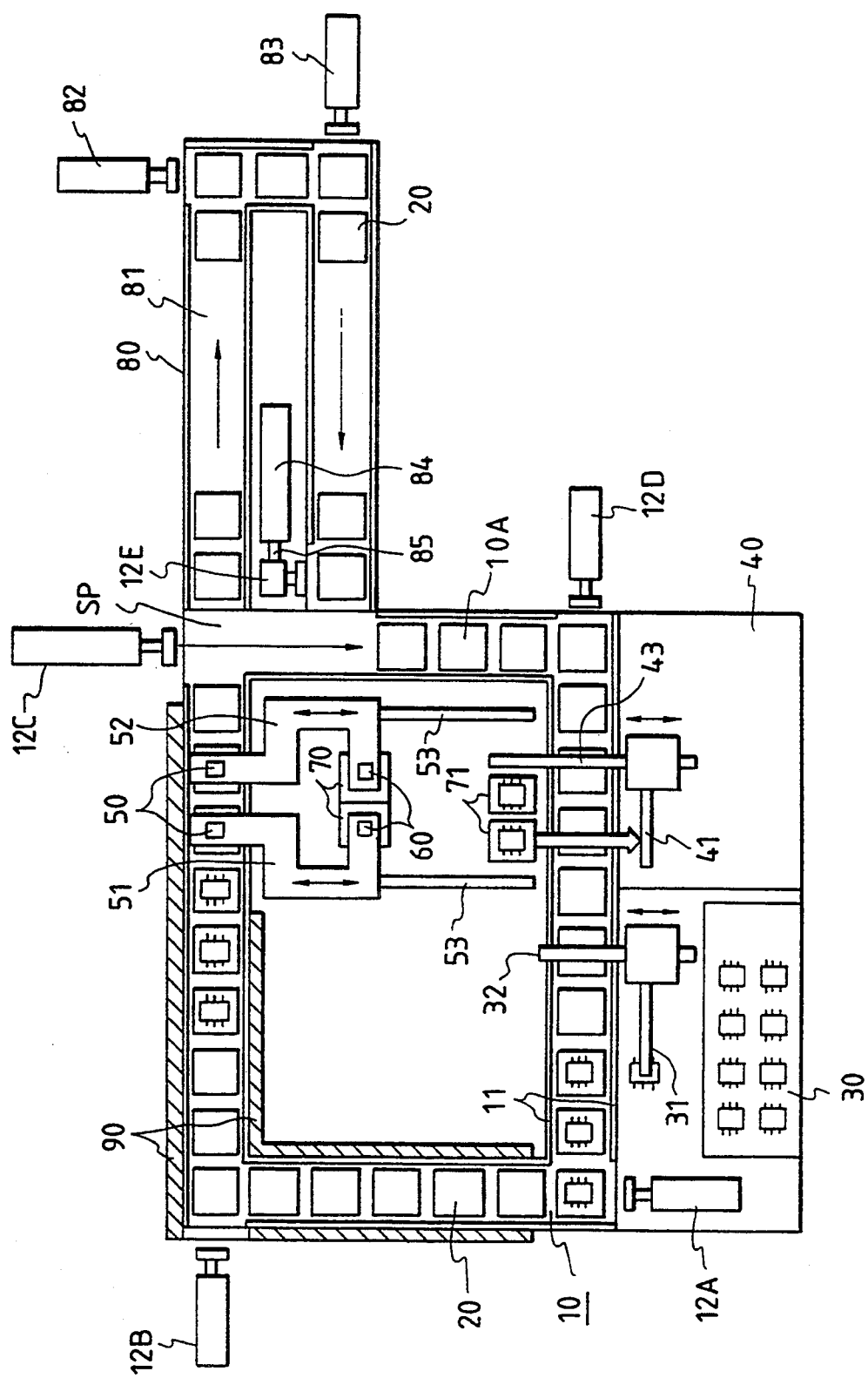
FIG. 7 is a plan view illustrating an example of an IC tester employing IC carriers according to the present invention.

FIG. 7 illustrates an example of an IC tester which employs the IC carriers 20 according to the present invention. Reference numeral 10 denotes a rectangular carrier circuit, which is provided in a horizontal plane and in which IC carriers 20 are guided by guide rails 11 provided on both sides of the circuit 10. At respective corners of the rectangular carrier circuit 10 there are provided drivers 12A, 12B, 12C and 12D each formed by an air cylinder, for instance.

In an IC test mode, the drivers 12A, 12B and 12D each drive the IC carriers 20 with a stroke corresponding to one IC carrier but the driver 12C drives the IC carrier 20 with a stroke corresponding to three IC carriers. An example of the IC carrier driving method will be described in brief. At first, empty IC carriers 20 are arranged in the rectangular circuit 10, leaving an empty space SP corresponding to three IC carriers in front of the driver 12C. Actuating the drivers 12B, 12A and 12D in this order, the IC carriers 20 in the circuit 10 are pushed forward by one pitch in the clockwise direction. Then, when actuating the driver 12C with the stroke corresponding to three IC carriers, the circuit returns to the state in which the empty space corresponding to three IC carriers is provided in front of the driver 12C. In this way, the IC carriers 20 are moved along the rectangular carrier circuit 10 and an empty space is maintained in front of the push driver 12E described later on.

A loading section 30 and an unloading section 40 are provided along one side of the rectangular carrier circuit 10. In the loading section a carrying apparatus 31 for holding and carrying an IC by suction (hereinafter referred to as a suction carrier) is provided for loading use, whereas in the unloading section a carrying apparatus 41 for holding and carrying an IC by suction (hereinafter referred to as suction carrier) is provided for sorting use. The suction carriers 31 and 41 each have an air chuck (not shown) and hold and carry an IC by the air chuck. The suction carrier 31 is supported by a rail 32 so that it can reciprocate between the loading section and the rectangular carrier circuit 10. The suction carrier 31 loads ICs on the IC carriers 20 arranged in the circuit 10. When one IC is loaded on one IC carrier 20, the driver 12D is actuated to move the IC carriers 20 by one pitch (for convenience' sake, this direction will hereinafter be referred to as a horizontal direction and a direction perpendicular to it as a vertical direction). As a result, an empty IC carrier 20 is supplied to the position of the loading suction carrier 31, which loads one IC on the empty IC carrier 20 from the loading section 30. In this way, ICs to be tested are loaded on the IC carriers 20 which have passed by the position of the loading suction carrier 31 one after another.

The IC carriers 20 each loaded with an IC are pushed forward by the driver 12A in the vertical direction and are further pressed in the horizontal direction by the driver 12B to the position of a first carrying apparatus 50 for holding and carrying an IC by suction (hereinafter referred to as suction carrier). This example is shown to employ two first suction carriers 50 spaced apart by the pitch of arrangement of the IC carriers 20. The two first suction carriers 50 are mounted at end portions of carriages 51 and 52 which can be operated independently of each other. The carriages 51 and 52 are movably supported by the first suction carrier 50 of each carriage lies above the rectangular carrier circuit 10, the second suction carrier 60 of the same carriage lies above a test section 70.

With the above construction, when the first suction carrier 50 sucks an IC from the IC carrier 20, the second suction carrier 60 at the same carriage can suck a tested IC from the test section 70. After the first suction carrier 50 of each carriage sucks the IC from the IC carrier 20 and the second suction carrier 60 of each carriage sucks the tested IC from the test section 70, the carriages 51 and 52 move along the rails 53 and the first suction carriers 50 reach the position above the test section 70, whereas the second suction carriers 60 are placed on transfer stands 71 provided at one end of the rails 53.

The suction carrier 41 provided in the unloading section 40 moves along a rail 43 provided between the transfer stand 71 and the unloading section 40 and carries the tested IC from the former to the latter. The tested IC thus carried to the unloading section 40 is sorted in accordance with the result of the test and stored in a magazine or the like accordingly. The IC carrier having passed through the position of the first suction carrier 50 is empty. In the test mode, the empty IC carrier 20 is turned from the vertical direction to the horizontal direction the drivers 12C and 12D and are brought to the front of the loading section 30, thereafter starting the next circulation.

Figure 8:
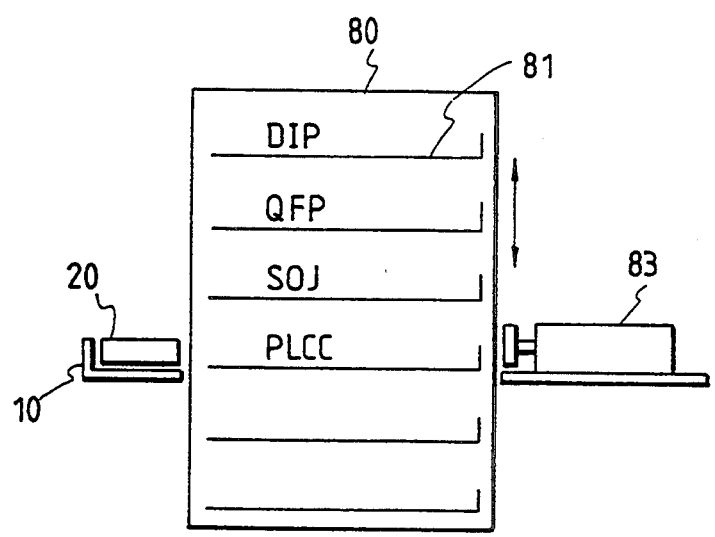
FIG. 8 is a side view for illustrating an IC carrier housing section of the tester of FIG. 7.

An IC carrier storage section 80 is provided on a prolonged line of the side of the rectangular carrier circuit 10 along which the IC carriers 20 are driven by the driver 12B. The IC carrier storage section 80 has a square U-shaped (channel shaped) carrier passage 81 and drivers 82 and 83 are provided at two corners of the passage 81, respectively. The carrier passage 81 has a length large enough to store one set of IC carriers (50 to 100, for example) 20 which circulate through the rectangular carrier circuit 10, and as shown in FIG. 8, such square U-shaped carrier passages 81 for storing the IC carriers 20 are disposed in layers and are moved up and down to select IC carriers of a desired kind or type.

To exchange the currently used IC carriers with those of another kind, the carrier passage 81 of the layer which has stored therein the IC carriers 20 of the desired kind is brought up to a position flush with the rectangular carrier circuit 10. Then the driver 12C is stopped from operation. At the same time, a set cylinder 84 provided outside the carrier circuit 10 projects out its rod 85, by which the push driver 12E mounted on the tip of the rod 85 is put on the rectangular carrier circuit 10.

Since the driver 12C stops, the IC carriers 20 circulating around the carrier circuit 10 by the drivers 12D, 12A and 12B are pushed, one by one, into the angular U-shaped carrier passage 81 in the IC carrier storage section 80. When one IC carrier 20 is pushed into the carrier passage 81 from the rectangular carrier circuit 10, drivers 82 and 83 are actuated, discharging one new IC carrier 20 into the rectangular carrier circuit 10 from the IC carrier storage section 80. The new IC carrier 20 thus discharged from the IC carrier storage section 80 is pushed in the vertical direction by the driver 12E along the rectangular carrier circuit 10. Thereafter, the drivers 12B, 12A, 12D, 12E, 83 and 82 are actuated in this order. By repeating such an operation, the IC carriers 20 on the rectangular carrier circuit 10 are stored in the IC carrier storage section 80 and the IC carriers 20 stored in the IC carrier storage section 80 are discharged onto the rectangular carrier circuit 10. Thus the IC carriers 20 on the carrier circuit 10 are replaced, one by one, with empty IC carriers from the IC carrier storage section 80.

For instance, the driver shaft 27A, shown in FIG. 1, is provided under the position 10A of the carrier passage 10, and by turning the spiral disk 23 of the IC carrier 20 at this position 10A, the IC carrier 20 can automatically be adapted to the new IC standard or specification.

As described above, according to the present invention, ICs of different sizes can be carried by the same IC carrier 20 because it is capable of changing the size for positioning the IC to be loaded thereon. Furthermore, since different types of ICs can be loaded on the same IC carrier 20 only by changing the shape of each of its support members $24_1$ and $24_2$, it is possible to assemble an IC carrier for different types of ICs, using many parts in common. Thus, various ICs can be carried by preparing IC carriers 20 for each set of ICs to be tested having a different terminal lead-out structure. Hence, the IC carrier according to the present invention is suitable for the construction of a fully automated IC tester.

It will be apparent that many modifications and variations may be effected without departing from the scope of the novel concepts of the present invention.

What is claimed is:

1. An IC carrier for loading ICs of different sizes thereon comprising:
   a box-shaped frame member having a circular concavity formed in the inner surface of the bottom thereof and a window formed in said circular concavity, through which a drive means can be inserted from the outside;

a disk having a spiral groove formed on one surface thereof and received within said circular concavity with the other surface of the disk abutting against the surface of the circular concavity in such a manner that the disk is rotatable within the circular concavity, said disk including engagement means formed at a portion thereof exposed to said window of the bottom of the box-shaped frame member, said engagement means of the disk being adapted to be engaged with the drive means inserted through said window to rotate the disk;

at least one pair of IC support members disposed over the disk symmetrically with respect to its center and opposed to each other, said pair of IC support members being mounted to said box-shaped frame member to be movable in a straight-line direction, each of said IC support members having engaging means protruding from the underside thereof for engaging with said spiral groove of the disk and having on the upper side thereof at least one IC positioning portion for an IC to be loaded thereon, whereby the pair of IC support members can move in opposite directions to each other in said straight-line direction by rotation of the disk by the drive means so that the distance between the positioning portions of the pair of IC support members can be changed; and a frame-shaped cover for preventing the pair of IC support members from coming out of the box-shaped frame member and for slidably holding the pair of IC support members.

2. The IC carrier of claim 1 further comprising a guide plate disposed between said disk and said pair of IC support members, said guide plate having at least two elongated holes formed therein at opposed positions with respect to the center thereof to extend in said straight-line direction, said engaging means of the pair of IC support members being inserted through said respective elongated holes for engaging with the spiral groove of the disk.

3. The IC carrier of claim 1 wherein each of the pair of IC support members has a guide member protruding from its underside and said engaging means of the pair of IC support members are provided on the underside of said guide members, said guide members being slidably received in the respective elongated holes of said guide plate for movement in the elongated holes only in the longitudinal direction thereof.

4. The IC carrier of claim 1 wherein said engagement means of the disk comprises at least two through holes into which driving pins of the drive means can be inserted to rotate the disk.

5. An IC carrier for loading ICs of different sizes thereon comprising:

a box-shaped frame member having a circular concavity formed in the inner surface of the bottom thereof and a window formed in said circular concavity, through which a drive means can be inserted from the outside;

a disk having a spiral groove formed on one surface thereof and received within said circular concavity with the other surface of the disk abutting against the surface of the circular concavity in such a manner that the disk is rotatable within the circular concavity, said disk including engagement means formed at a portion thereof exposed to said window of the bottom of the box-shaped frame member, said engagement means of the disk being adapted to be engaged with the drive means inserted through said window to rotate the disk;

two pairs of IC support members disposed over the disk with one pair of IC support members positioned symmetrically with respect to its center in one straight-line direction orthogonal to another straight-line direction in which the other pair of IC support members are positioned symmetrically with respect to the center of the disk, each pair of IC support members being mounted to said box-shaped frame member to be movable in said respective straight-line directions orthogonal to each other, each of said IC support members having engaging means protruding from the underside thereof for engaging with said spiral groove of the disk and further having on the upper side thereof at least one IC positioning portion for an IC to be loaded thereon, whereby the two pairs of IC support members can move simultaneously in said respective straight-line directions by rotation of the disk by the drive means so that the distances between the positioning portions of each pair of IC support members can be changed simultaneously; and a frame-shaped cover for preventing the two pairs of IC support members from coming out of the box-shaped frame member and for slidably holding the two pairs of IC support members.

6. The IC carrier of claim 5 further comprising a guide plate disposed between said disk and said two pair of IC support members, said guide plate having four elongated holes made therein, two elongated holes of which are positioned symmetrically with respect to the center of said guide plate and extend in said one straight-line direction and the remaining two elongated holes of which are positioned symmetrically with respect to the center of said guide plate and extend in said another straight-line direction orthogonal to said one straight-line direction so as to form a cross by said four elongated holes, said engaging means of the IC support members being inserted through said respective elongated holes for engaging with the spiral groove of the disk.

7. The IC carrier of claim 5 wherein each of the IC support members has a guide member protruding from its underside and said engaging means of each of the IC support members is provided on the underside of each of said guide members, said guide members of the IC support members being slidably received in the respective elongated holes of said guide plate for movement in the elongated holes only in the longitudinal direction thereof.

8. The IC carrier of claim 5 wherein said engagement means of the disk comprises at least two through holes into which driving pins of the drive means can be inserted to rotate the disk.

9. An IC carrier for loading ICs of different sizes thereon comprising:

a box-shaped frame member having a circular concavity formed in the inner surface of the bottom thereof and a window formed in said circular concavity, through which a drive means can be inserted from the outside;

a disk having a spiral groove formed on one surface thereof and received within said circular concavity with the other surface of the disk abutting against the surface of the circular concavity in such a manner that the disk is rotatable within the circular concavity, said disk having a window formed therein at its central portion exposed to said window of the bottom of the box-shaped frame member, said disk including engagement means formed at a portion thereof exposed to said window of the box-shaped frame member, said engagement means of the disk being adapted to be engaged with the drive means inserted through the window of the box-shaped frame member to rotate the disk;

a pair of IC support members disposed over the disk symmetrically with respect to its center in one straight-line direction, each of said IC support members having engaging means protruding from the underside thereof for engaging with said spiral groove of the disk and further having on the upper side thereof at least one IC positioning portion for an IC to be loaded thereon;

a guide plate disposed between said disk and said, pair of IC support members, said guide plate having at least elongated clearance holes symmetrically formed therein with respect to the center thereof to extend in said one straight-line direction, whereby the pair of IC support members can move in said one straight-line direction by rotation of the disk by the drive means so that the distance between the positioned portions of the pair of IC support members can be changed, said guide plate further having a circular hole at its central portion and two guide channels in parallel with each other formed in the upper side thereof in another straight-line direction orthogonal to said one straight-line direction;

a pinion comprising a disk member and a small-diameter toothed wheel portion formed on top of said disk member, said pinion being disposed on said disk and rotatably received within said circular hole of the guide plate, said pinion including engagement means formed at a portion thereof exposed to said window of the disk, said engagement means of the pinion being adapted to be engaged with the drive means inserted through said windows of the box-shaped frame member and of the disk to rotate the pinion;

two racks slidably received in said respective guide channels of the guide plate to slide therealong, each of said two racks having teeth meshing with said pinion at each end of diametrically opposite ends thereof, respectively, each of said racks further having an upwardly extending positioning arm for holding an IC thereon, whereby the two racks can move in opposite directions to each other by rotation of the pinion by the drive means so that the distance between the positioning arms of the two racks can be changed independently of the change of the distance between the positioning portions of the pair of IC support members; and a frame-shaped cover for preventing the pair of IC support members from coming out of the box-shaped frame member and for slidably holding the pair of IC support members.

10. The IC carrier of claim 18 wherein each of said IC support members has a substantially rectangular plate member from underside of which said engaging means protrudes and on the upper side of which said IC positioning portion for an IC to De loaded is provided, and said guide plate has two guide projections protrusively provided on the top thereof symmetrically with respect to the center thereof, each of said rectangular plate members having a first elongated slot formed therein to extend in the direction of movement of each IC support member and including a strip-like guide arm projecting outwardly from substantially the center of one longer side of said rectangular plate member at right angles thereto, each of said strip-like guide arms having a second elongated slot formed in the end portion thereof to extend in the direction of movement of each IC support member in such a manner that said first elongated slot of one of said IC support members and said second elongated slot of the other IC support member overlap at least partly with each other, said two guide projections of the guide plate being slidably received in said respective overlapping first and second elongated slots whereby the pair of IC support members can move in said one straight-line direction by rotation of the disk.

11. The IC carrier of claim 9 wherein said engagement means of the disk comprises at least two through holes into which driving pins of the drive means can be inserted to rotate the disk.

12. The IC carrier of claim 9 wherein said engagement means of the pinion is at least two through holes into which driving pins of the drive means can be inserted through the windows of the box-shaped frame member and of the disk to rotate the pinion.

* * * * *